(12) United States Patent
Kitaura

(10) Patent No.: US 6,274,406 B1
(45) Date of Patent: Aug. 14, 2001

(54) SEMICONDUCTOR DEVICE AND A METHOD OF MANUFACTURING THE SAME

(75) Inventor: Takanori Kitaura, Tateyama (JP)

(73) Assignee: Nippon Steel Semiconductor Corporation, Tateyama (JP)

(*) Notice: Subject to any disclaimer, the term of this patent is extended or adjusted under 35 U.S.C. 154(b) by 0 days.

(21) Appl. No.: 09/597,141

(22) Filed: Jun. 20, 2000

Related U.S. Application Data (62) Division of application No. 08/970,809, filed on Nov. 14, 1997, now abandoned.

(30) Foreign Application Priority Data

Nov. 14, 1996 (JP) .................................................. 8-316902

(51) Int. Cl.⁷ .......................... H01L 21/44; H01L 21/48; H01L 21/50; H01L 21/46; H01L 21/78
(52) U.S. Cl. ...................... 438/111; 438/112; 438/114; 438/118; 438/123; 438/465
(58) Field of Search .................................. 438/111, 112, 438/114, 118, 123, 465

(56) References Cited

U.S. PATENT DOCUMENTS

| | | |
|---|---|---|
| 5,068,712 * | 11/1991 | Murakami et al. . |
| 5,194,931 * | 3/1993 | Araki . |
| 5,206,536 * | 4/1993 | Lim . |
| 5,358,906 * | 10/1994 | Lee . |
| 5,359,224 * | 10/1994 | Heinen et al. . |
| 5,559,316 * | 9/1996 | Tomoda . |
| 5,583,375 * | 12/1996 | Tsubosaki et al. . |
| 5,696,033 * | 12/1997 | Kinsman . |

FOREIGN PATENT DOCUMENTS 4-291950  10/1992  (JP) .

* cited by examiner

Primary Examiner—David E. Graybill
(74) Attorney, Agent, or Firm—Connolly Bove Lodge & Hutz (57) ABSTRACT

A semiconductor device of this invention has an LOC (Lead On Chip) structure, and a protective film consisting of a thermoplastic (thermosetting) resin material such as a thermoplastic (thermosetting) polyimide resin or a thermoplastic (thermosetting) polyamide resin is formed on the surface of a semiconductor chip having a DRAM. The lower surface of a lead frame is positioned to the upper surface of the semiconductor chip, on which the protective film is formed, and the upper surface of the semiconductor chip is bonded and fixed to the lower surface of the distal end portion of an inner lead with only the protective film interposed therebetween such that bonding pads appear between opposing bus bars. According to this invention, the protective film serves not only as an α-ray protective film but also as an insulating material and an adhesive material. Since the semiconductor chip and the inner leads are fixed with a very simple arrangement, the manufacturing process can be largely simplified, and the number of processes can be reduced.

8 Claims, 12 Drawing Sheets

SEMICONDUCTOR DEVICE AND A METHOD OF MANUFACTURING THE SAME

CROSS REFERENCE TO RELATED APPLICATION

This application is a divisional of U.S. patent application Ser. No. 08/970,809, filed Nov. 14, 1997, now abandoned.

BACKGROUND OF THE INVENTION

1. Field of the Invention

The present invention relates to a semiconductor device and a method of manufacturing the same. More particularly, the present invention relates to a technique suitable for a package having an LOC (Lead On Chip) structure of a large-scale integrated circuit.

2. Description of the Related Art

Figure 11:
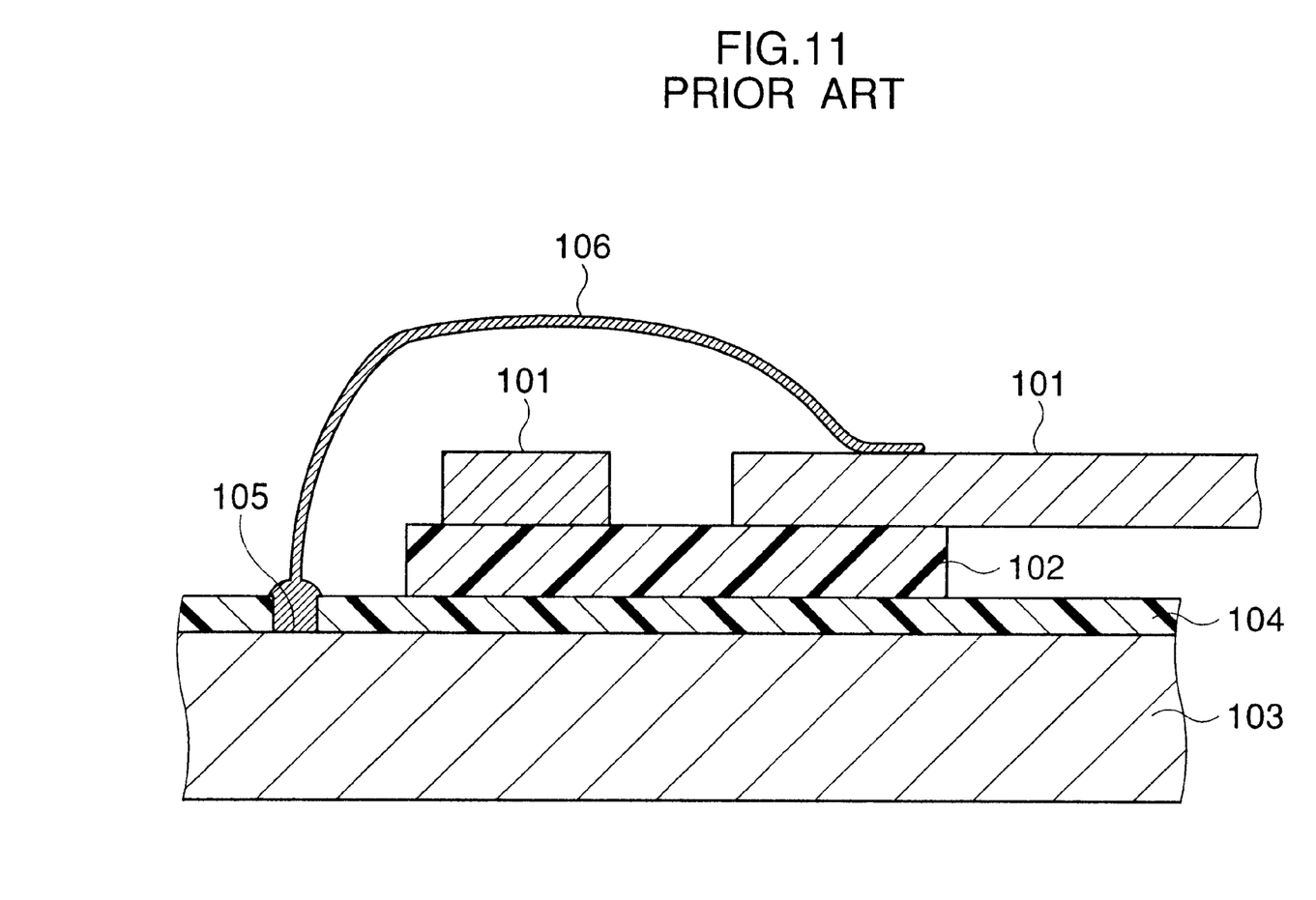
FIG. 11 is a schematic sectional view showing part of a conventional semiconductor device.

The LOC (Lead On Chip) structure allows a relatively small package to accommodate a large semiconductor chip to realize high-density mounting, and is therefore suitable for, e.g., a 16-bit DRAM (Dynamic Random Access Memory). An example of the semiconductor device having the LOC structure is disclosed in, e.g., Japanese Patent Laid-Open No. 4-291950. In the semiconductor device disclosed in this reference, a band-shaped insulating tape 102 with an adhesive applied to its two surfaces is bonded to an inner lead 101 of a lead frame, as shown in FIG. 11. On the other hand, a polyimide film 104 serving as an α-ray protective film is bonded on a predetermined region of a semiconductor chip 103 where memory cells and their peripheral circuits are formed. As shown in FIG. 11, the upper surface of the polyimide film 104 on the semiconductor chip 103 is bonded and fixed to the inner lead 101 with the insulating tape 102 interposed therebetween, and a bonding pad 105 formed on the semiconductor chip 103 is connected to the inner lead 101 by a bonding wire 106. In the semiconductor device disclosed in Japanese Patent Laid-Open No. 4-291950, the insulating tape 102 has a comb-like shape to prevent voids.

Figure 12:
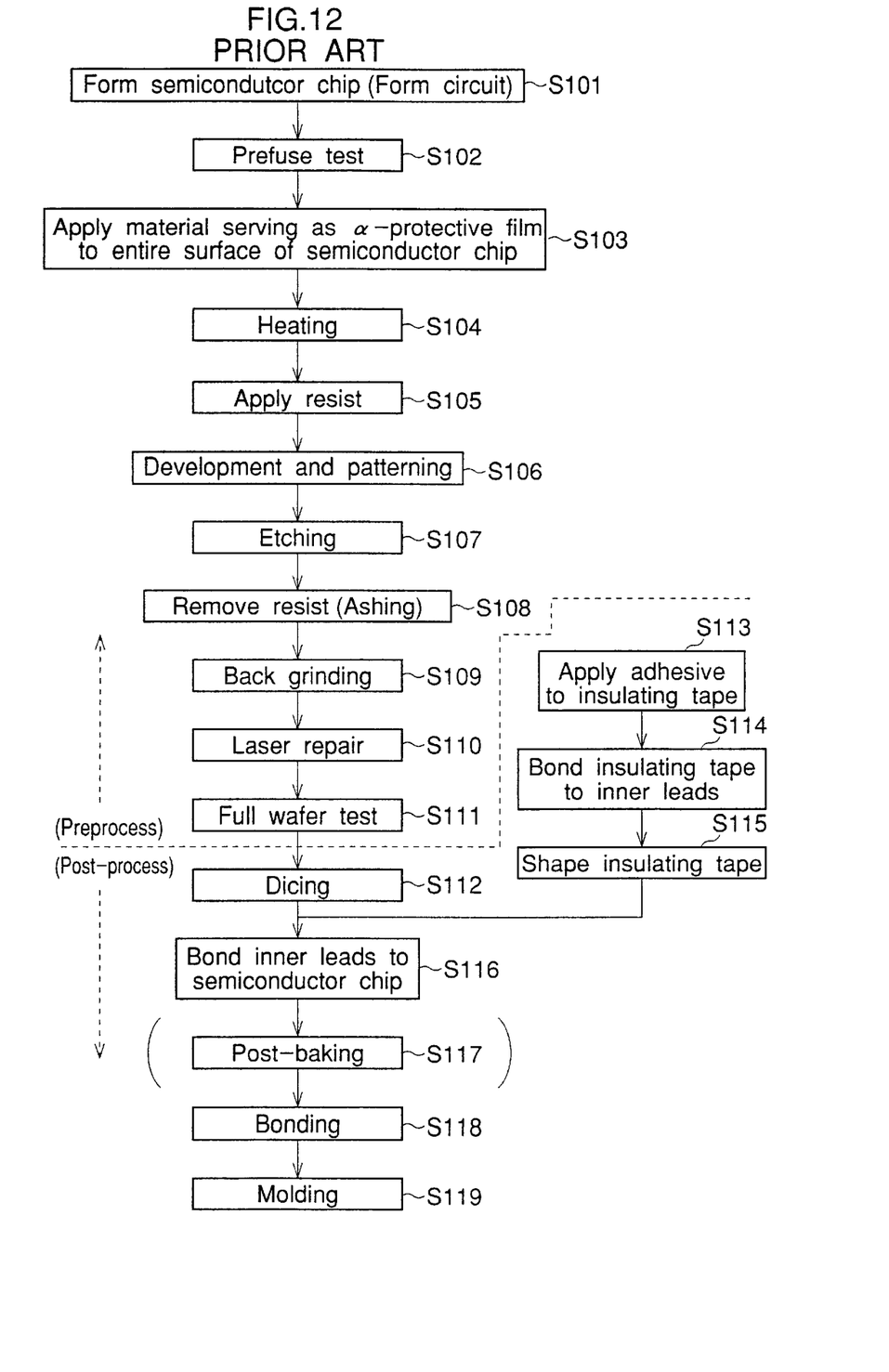
FIG. 12 is a schematic flow chart showing the steps in manufacturing the conventional semiconductor device.

A method of manufacturing the above semiconductor device will be briefly described with reference to FIG. 12. The manufacturing process is divided into a preprocess group before cutting a semiconductor wafer into semiconductor chips and a post-process group after cutting. In the first step of the preprocess group, memory cells and their peripheral circuits are formed on a semiconductor wafer, and a plurality of semiconductor chips are formed on the semiconductor wafer (step S101).

After the prefuse test of the semiconductor chips (step S102), a material film, e.g., a polyimide resin film in this case, serving as an α-ray protective film is applied to the entire surface of each semiconductor chip (step S103).

The semiconductor wafer on which the protective film is formed is heated at a predetermined temperature (step S104).

A photoresist is applied to the surface of the protective film of each semiconductor chip (step S105), and developed and patterned by photolithography to form an etching mask (step S106). The protective film is anisotropically etched into a shape conforming to the etching mask, and a plurality of openings are formed in the protective film to expose the surfaces of bonding pads formed on the semiconductor chip under the protective film (step S107). The resist mask is removed by ashing using $O_2$ plasma (step S108). Back grinding (step S109) and laser repair (step S110) are performed, and a full wafer test is performed in the final step of the preprocess group (step S111).

Next, in the first step of the post-process group, dicing is performed to cut the semiconductor wafer into the semiconductor chips (step S112). The following three processes are performed simultaneously with the operation in step S112. An adhesive consisting of a polyimide resin material is applied to the two surfaces of a band-shaped polyimide film as an insulating tape (step S113), the insulating tape is bonded to inner leads (step S114), and the insulating tape is formed into a predetermined shape (step S115).

The inner leads are pressed against the surface of the protective film of each cut semiconductor chip with the insulating tapes interposed therebetween. In this state, the resultant structure is heated to bond and fix the semiconductor chip to the inner leads (step S116). Each semiconductor chip is loaded into a furnace and subjected to postbaking (step S117: this step can be omitted in some cases). The bonding pad in each opening formed in the protective film is connected to a corresponding inner lead by a bonding wire (step S118). Resin molding is performed to cover the entire semiconductor chip (step S119), thereby completing a package.

According to the above-described method, since an adhesive having the same properties as the insulating tape is applied to the two surfaces of the insulating tape, the thickness of the entire insulating tape can be adjusted appropriately, so cracks in the sealing resin and semiconductor chip can be prevented. However, this method requires various processes (steps S113 to S115) for bonding the insulating tape to the inner leads, so the number of processes in manufacturing a lead frame increases, and the processes become cumbersome. In addition, the insulating tape is difficult to handle because it tends to be burred upon cutting and attract foreign objects. Furthermore, since the number of components increases, the cost largely increases.

SUMMARY OF THE INVENTION

It is an object of the present invention to easily and reliably realize a semiconductor device having a simple LOC structure without using an insulating tape for bonding a semiconductor chip to inner leads.

According to an aspect of the present invention, there is provided a semiconductor device having a structure in which a semiconductor chip is bonded and fixed to an inner lead of a lead frame while being insulated from the inner lead, and a bonding pad formed on the semiconductor chip is connected to the inner lead by a bonding wire, wherein a thermoplastic resin film is formed on a surface of the semiconductor chip, and an upper surface of the thermoplastic resin film is directly bonded to a lower surface of the inner lead.

Preferably, the thermoplastic resin film is at least one of a thermoplastic polyimide resin film and a thermoplastic polyamide resin film.

Preferably, an opening is formed in the thermoplastic resin film to expose a surface of the bonding pad, and the bonding pad in the opening is connected to the inner lead by the bonding wire.

According to another aspect of the present invention, there is provided a semiconductor device having a structure in which a semiconductor chip is bonded and fixed to an inner lead of a lead frame while being insulated from the inner lead, and a bonding pad formed on the semiconductor chip is connected to the inner lead by a bonding wire, wherein a thermosetting resin film is formed on a surface of the semiconductor chip, and an upper surface of the thermosetting resin film is directly bonded to a lower surface of the inner lead.

Preferably, the thermosetting resin film is at least one of a thermosetting polyimide resin film and a thermosetting polyamide resin film.

Preferably, an opening is formed in the thermosetting resin film to expose a surface of the bonding pad, and the bonding pad in the opening is connected to the inner lead by the bonding wire.

According to still another aspect of the present invention, there is provided a semiconductor device having a structure in which a semiconductor chip is bonded and fixed to an inner lead of a lead frame while being insulated from the inner lead, and a bonding pad formed on the semiconductor chip is connected to the inner lead by a bonding wire, wherein a thermoplastic resin film covering a surface of the semiconductor chip is formed between the semiconductor chip and the inner lead, and the semiconductor chip is bonded to the inner lead using only the thermoplastic resin film.

Preferably, the thermoplastic resin film is at least one of a thermoplastic polyimide resin film and a thermoplastic polyamide resin film.

Preferably, an opening is formed in the thermoplastic resin film to expose a surface of the bonding pad, and the bonding pad in the opening is connected to the inner lead by the bonding wire.

According to still another aspect of the present invention, there is provided a semiconductor device having a structure in which a semiconductor chip is bonded and fixed to an inner lead of a lead frame while being insulated from the inner lead, and a bonding pad formed on the semiconductor chip is connected to the inner lead by a bonding wire, wherein a thermosetting resin film covering a surface of the semiconductor chip is formed between the semiconductor chip and the inner lead, and the semiconductor chip is bonded to the inner lead using only the thermosetting resin film.

Preferably, the thermosetting resin film is at least one of a thermosetting polyimide resin film and a thermosetting polyamide resin film.

Preferably, an opening is formed in the thermosetting resin film to expose a surface of the bonding pad, and the bonding pad in the opening is connected to the inner lead by the bonding wire.

According to still another aspect of the present invention, there is provided a semiconductor device having a structure in which a semiconductor chip is bonded and fixed to an inner lead of a lead frame while being insulated from the inner lead, and a bonding pad formed on the semiconductor chip is connected to the inner lead by a bonding wire, comprising a thermoplastic resin film having a lower surface bonded to the semiconductor chip and an upper surface bonded to the inner lead.

Preferably, the thermoplastic resin film is at least one of a thermoplastic polyimide resin film and a thermoplastic polyamide resin film.

Preferably, an opening is formed in the thermoplastic resin film to expose a surface of the bonding pad, and the bonding pad in the opening is connected to the inner lead by the bonding wire.

According to still another aspect of the present invention, there is provided a semiconductor device having a structure in which a semiconductor chip is bonded and fixed to an inner lead of a lead frame while being insulated from the inner lead, and a bonding pad formed on the semiconductor chip is connected to the inner lead by a bonding wire, comprising a thermosetting resin film having a lower surface bonded to the semiconductor chip and an upper surface bonded to the inner lead.

Preferably, the thermosetting resin film is at least one of a thermosetting polyimide resin film and a thermosetting polyamide resin film.

Preferably, an opening is formed in the thermosetting resin film to expose a surface of the bonding pad, and the bonding pad in the opening is connected to the inner lead by the bonding wire.

According to still another aspect of the present invention, there is provided a method of manufacturing a semiconductor device, comprising the first step of applying a thermoplastic resin material to which a volatile component is added, to an entire surface of a semiconductor wafer, the second step of heating the semiconductor wafer at a first temperature, the third step of cutting the semiconductor wafer into a plurality of semiconductor chips, the fourth step of bringing the semiconductor chip into contact with an inner lead with only the thermoplastic resin material interposed therebetween, pressing the semiconductor chip against the inner lead while heating the semiconductor chip and the inner lead at a second temperature higher than the first temperature, and the fifth step of connecting a bonding pad on the semiconductor chip to the inner lead by a bonding wire.

Preferably, the first temperature is higher than an volatilization temperature of the volatile component and lower than a plastication temperature of the thermoplastic resin material, and the second temperature is higher than the plastication temperature of the thermoplastic resin material.

Preferably, the method further comprises, between the second step and the third step, the sixth step of forming an opening in the thermoplastic resin material to expose a surface of the bonding pad, and the fifth step includes connecting the bonding pad in the opening to the inner lead by the bonding wire.

Preferably, the thermoplastic resin material is at least one of a thermoplastic polyimide resin material and a thermoplastic polyamide resin material.

According to still another aspect of the present invention, there is provided a method of manufacturing a semiconductor device, comprising the first step of applying a thermosetting resin material to an entire surface of a semiconductor wafer, the second step of heating the semiconductor wafer at a first temperature to make the thermosetting resin material elastic and facilitate fabrication, the third step of cutting the semiconductor wafer into a plurality of semiconductor chips, the fourth step of bringing the semiconductor chip into contact with an inner lead with only the thermosetting resin material interposed therebetween, pressing the semiconductor chip against the inner lead while heating the semiconductor chip and the inner lead at a second temperature higher than the first temperature, and the fifth step of connecting a bonding pad on the semiconductor chip to the inner lead by a bonding wire.

Preferably, the first temperature is lower than a setting temperature of the thermosetting resin material, and the second temperature is higher than the setting temperature of the thermosetting resin material.

Preferably, the method further comprises, between the second step and the third step, the sixth step of forming an opening in the thermosetting resin material to expose a surface of the bonding pad, and the fifth step includes connecting the bonding pad in the opening to the inner lead by the bonding wire.

Preferably, the thermosetting resin material is at least one of a thermosetting polyimide resin material and a thermosetting polyamide resin material.

In the present invention, the thermoplastic resin film or thermosetting resin film is formed as the protective film applied to the surface of the semiconductor chip, and the semiconductor chip and the inner leads are bonded and fixed under predetermined temperature adjustment. In this case, not an insulating member such as an insulating tape but only the protective film is interposed between the semiconductor chip and the inner leads, and the protective film is used not only as an α-ray protective film but also as an insulating material and an adhesive material. Since the semiconductor chip and the inner leads are fixed with a very simple arrangement, the manufacturing process can be largely simplified, and the number of processes can be reduced. In addition, cracks in the sealing resin and the semiconductor chip can be prevented by adjustment of the thickness of the protective film.

Therefore, according to the present invention, a semiconductor device having a simple LOC structure can be easily and reliably realized without using an insulating tape for bonding the semiconductor chip to the inner leads.

DETAILED DESCRIPTION OF THE PREFERRED EMBODIMENTS

Embodiments of a semiconductor device having an LOC structure according to the present invention and a method of manufacturing the same will be described below in detail with reference to the accompanying drawings.

First Embodiment

Figure 1:
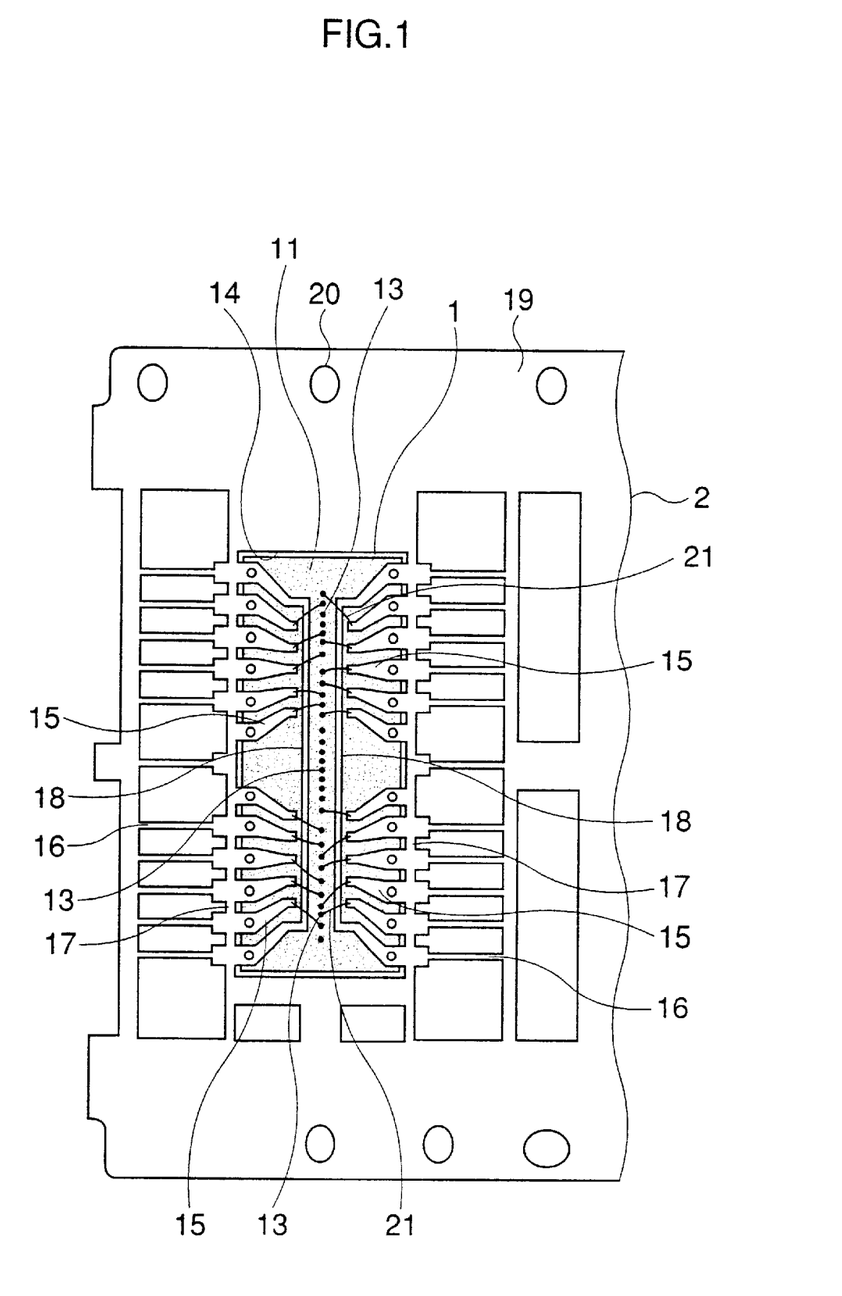
FIG. 1 is a schematic plan view showing a semiconductor device according to the first embodiment of the present invention.
Figure 2:
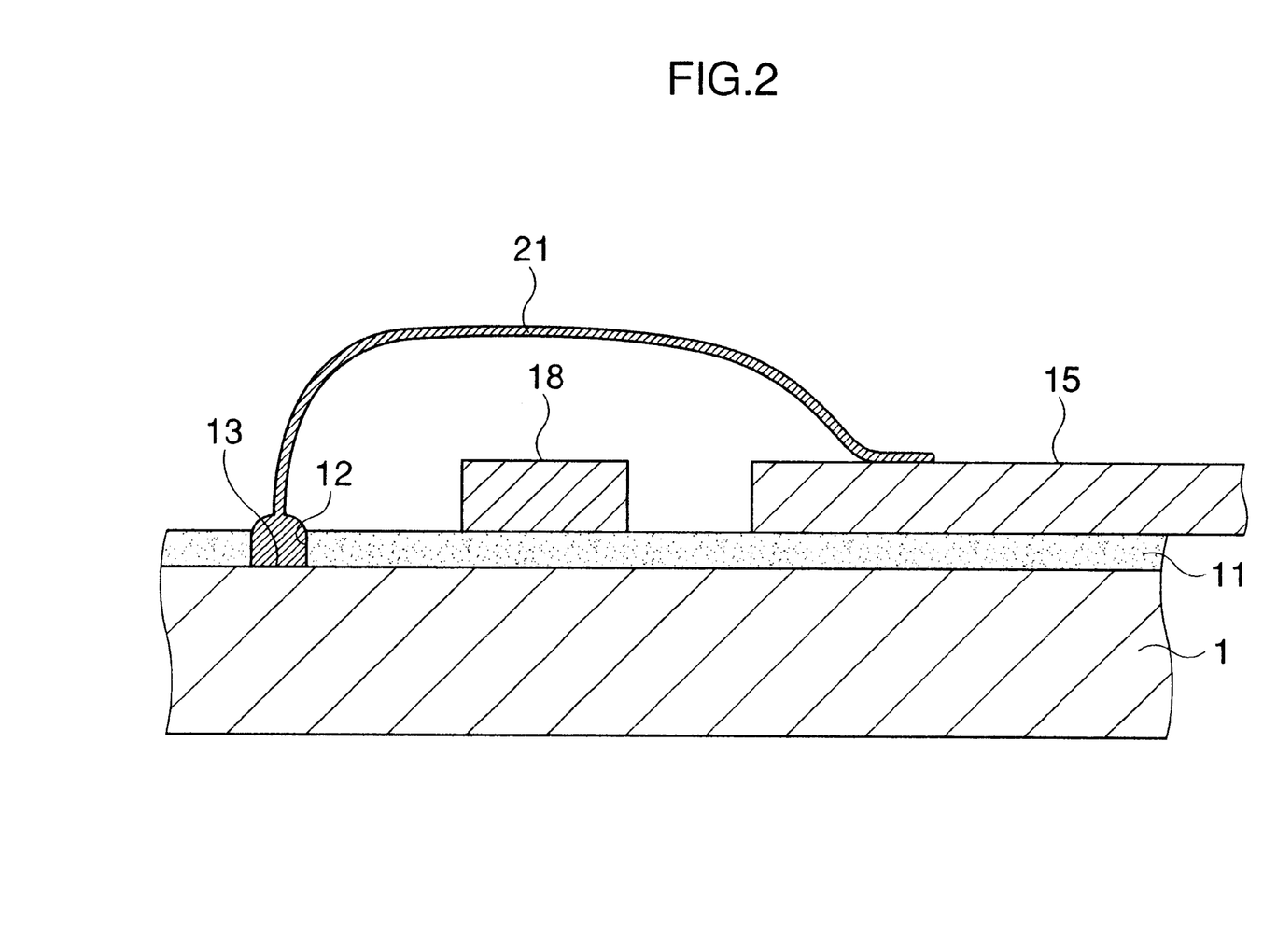
FIG. 2 is a schematic sectional view showing a region from an inner lead to a portion near a bonding pad shown in FIG. 1.

The first embodiment will be described first. The schematic arrangement of this semiconductor device will be described first. FIG. 1 is a plan view schematically showing the semiconductor device from which the mold resin is removed. FIG. 2 is a sectional view showing a region from an inner lead 15 to a portion near a bonding pad 13 shown in FIG. 1. This semiconductor device comprises a semiconductor chip 1 on which a semiconductor device is formed (in this case, a DRAM is exemplified as the semiconductor device), and a lead frame 2 fixed to the semiconductor chip 1.

In the semiconductor chip 1, a plurality of memory cells (memory cell regions) each having at least one transistor and capacitor are arranged in a matrix, and a plurality of peripheral circuits (peripheral circuit regions) of the memory cells are formed around the memory cell array. A protective film 11 for protecting these circuits from an α-ray is formed on the surface of the semiconductor chip 1 to cover the memory cell regions and the peripheral circuit regions. The protective film 11 consists of a thermoplastic resin material such as a thermoplastic polyimide resin or a thermoplastic polyamide resin. A plurality of openings 12 are formed in the protective film 11 to partially expose the surface of the semiconductor chip 1. As shown in FIG. 2, the bonding pad 13 consisting of a conductive material and electrically connected to a predetermined portion of the semiconductor chip 1 is formed in each opening 12.

The lead frame 2 has a rectangular device hole 14 almost at its central portion and comprises the plurality of inner leads 15 substantially symmetrically projecting from opposing sides of the edge of the device hole 14 toward the device hole 14, outer leads 16 connected to the inner leads 15, dam bars 17 crossing the boundary portions between the inner leads 15 and the outer leads 16, bus bars 18 each connecting the end inner leads 15 of the inner leads 15 on each of the opposing sides of the edge of the device hole 14 and arranged along the distal ends of the remaining inner leads 15, a base portion 19 supporting the dam bars 17, and sprocket holes 20 formed in the base portion 19 at a predetermined interval. A plurality of lead frames 2 are continuously formed in correspondence with a plurality of semiconductor chips 1. FIG. 1 shows one lead frame 2 corresponding to one semiconductor chip 1.

As shown in FIG. 2, the lower surface of the lead frame 2 is positioned to the upper surface of the semiconductor chip 1, on which the protective film 11 is formed, and the upper surface of the semiconductor chip 1 is bonded and fixed to the lower surface of the distal end portion of each inner lead 15 with only the protective film 11 interposed therebetween such that the bonding pads 13 appear between the opposing bus bars 18. In this case, bonding is made using thermoplasticity of the protective film 11, as will be described later. In addition, the protective film 11 sufficiently serves as an insulating member at the bonding portion between the semiconductor chip 1 and each inner lead 15 because the protective film 11 consists of a polyimide resin or a polyamide resin.

The upper surface of the distal end portion of each inner lead 15 is connected to a corresponding one of the bonding pads 13 by a bonding wire 21 consisting of a gold (Au) wire, using wire bonding. The bonding wire 21 may be a copper (Cu) wire, a shielded wire formed by coating the surface of a metal wire with an insulating resin, or the like.

The outer leads 16 connected to the inner leads 15 and separated from each other upon cutting the dam bars 17 are used as a power supply terminal for supplying a power supply voltage to circuits constituting the DRAM, a data signal input terminal, a write enable terminal, a row address strobe signal terminal, a column address strobe signal terminal, a data signal output terminal, a reference voltage terminal, a free terminal, and the like.

Figure 3:
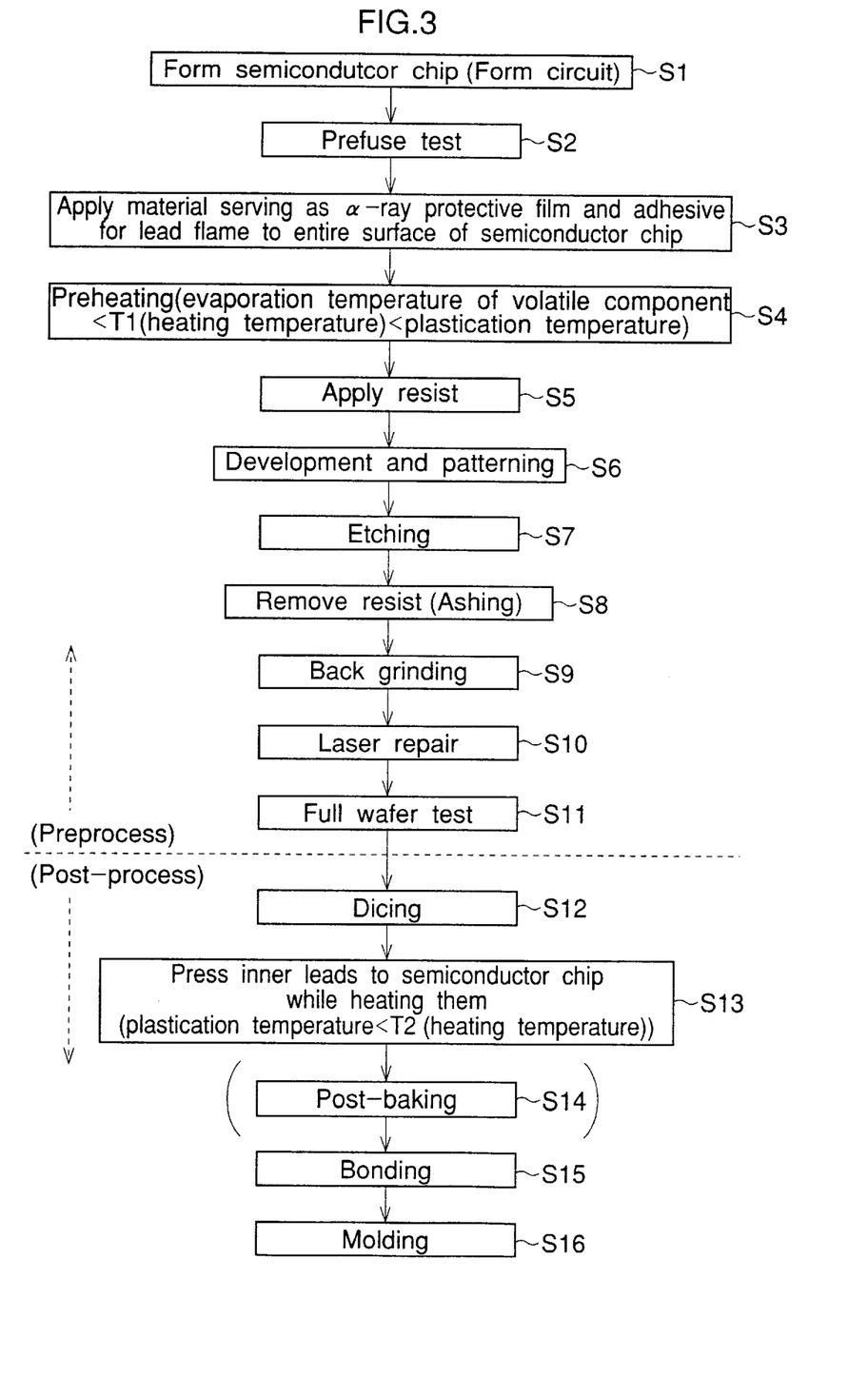
FIG. 3 is a schematic flow chart showing the steps in manufacturing the semiconductor device according to the first embodiment.
Figure 4:
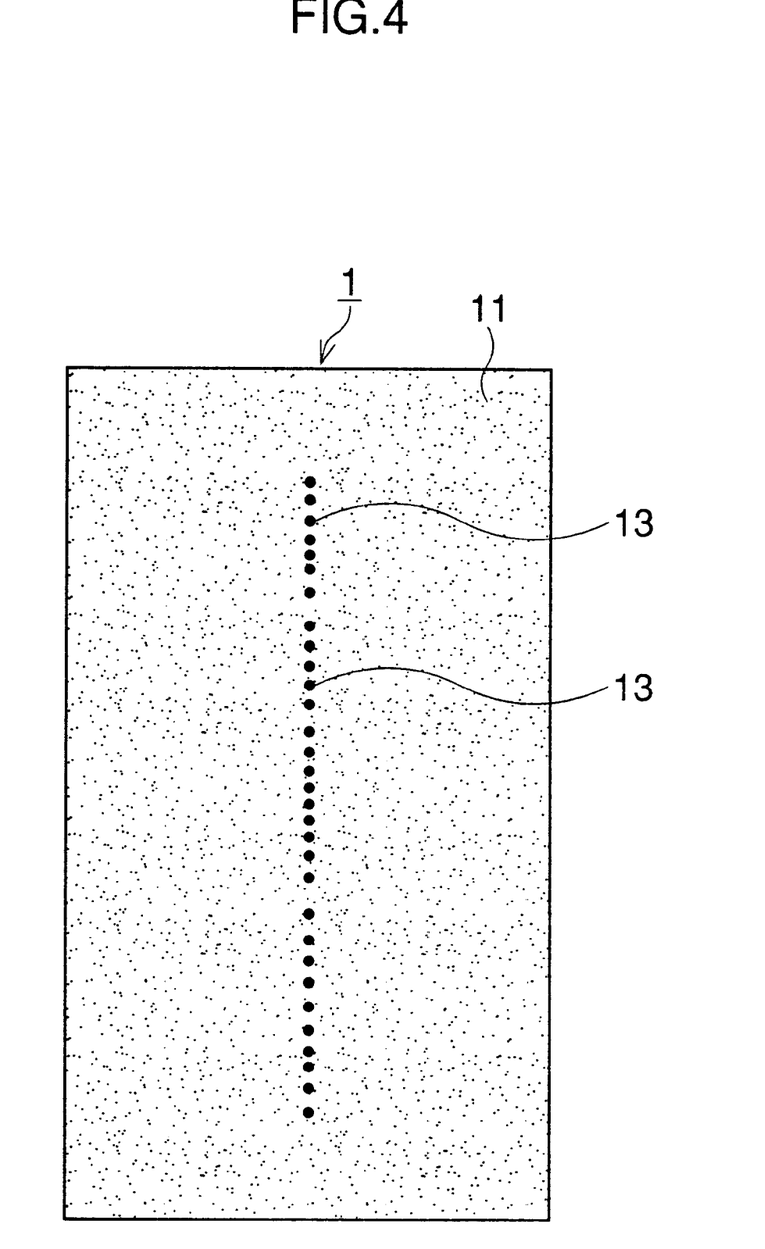
FIG. 4 is a schematic plan view showing a semiconductor chip of the first embodiment.
Figure 5:
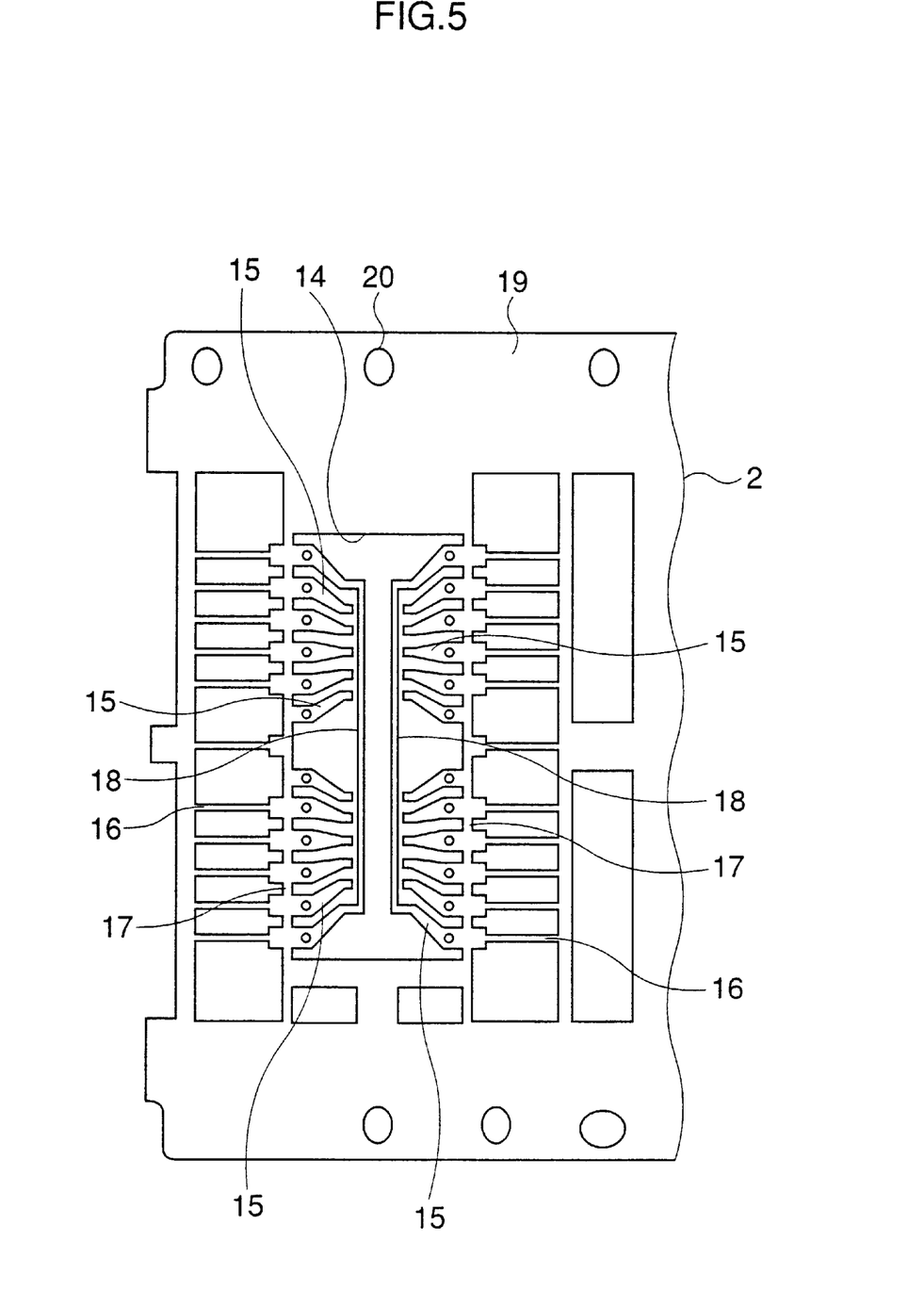
FIG. 5 is a schematic plan view showing a lead frame.

A method of manufacturing the semiconductor device of the first embodiment will be described next. FIG. 3 is a schematic flow chart showing the steps in manufacturing the semiconductor device. FIG. 4 is a plan view of the semiconductor chip. FIG. 5 is a plan view of the lead frame.

The manufacturing process is divided into a preprocess group before cutting a semiconductor wafer into semiconductor chips and a post-process group after cutting. In the first step of the preprocess group, memory cells and their peripheral circuits are formed on a semiconductor wafer, and the plurality of semiconductor chips 1 are formed on the semiconductor wafer (step S1).

After the prefuse test of the semiconductor chips 1 (step S2), the protective film 11 consisting of a thermoplastic resin film, e.g., a thermoplastic polyimide resin film or a thermoplastic polyamide resin film in this case, which contains a volatile component and serves not only as an α-ray protective film but also as an adhesive and an insulating material is applied to the entire surface of each semiconductor chip 1, as shown in FIG. 4 (step S3). The semiconductor wafer on which the protective film 11 is formed is heated at a predetermined temperature T1 (step S4)

The predetermined temperature T1 must be higher than the evaporation temperature of the volatile component and lower than the plastication temperature of the protective film 11. A photoresist is applied to the surface of the protective film 11 of each semiconductor chip 1 (step S5), and developed and patterned by photolithography to form an etching mask (step S6). The protective film 11 is anisotropically etched into a shape conforming to the etching mask, and the plurality of openings 12 are formed in the protective film 11 to expose the surfaces of the bonding pads 13 formed on the semiconductor chip 1 under the protective film 11 (step S7). The resist mask is removed by ashing using $O_2$ plasma (step S8). Back grinding (step S9) and laser repair (step S10) are performed, and a full wafer test is performed in the final step of the preprocess group (step S11).

Next, in the first step of the post-process group, dicing is performed to cut the semiconductor wafer into the semiconductor chips (step S12). In the first embodiment, no insulating tape need be formed, unlike the prior art, so the steps of manufacturing this insulating tape are omitted.

Figure 6:
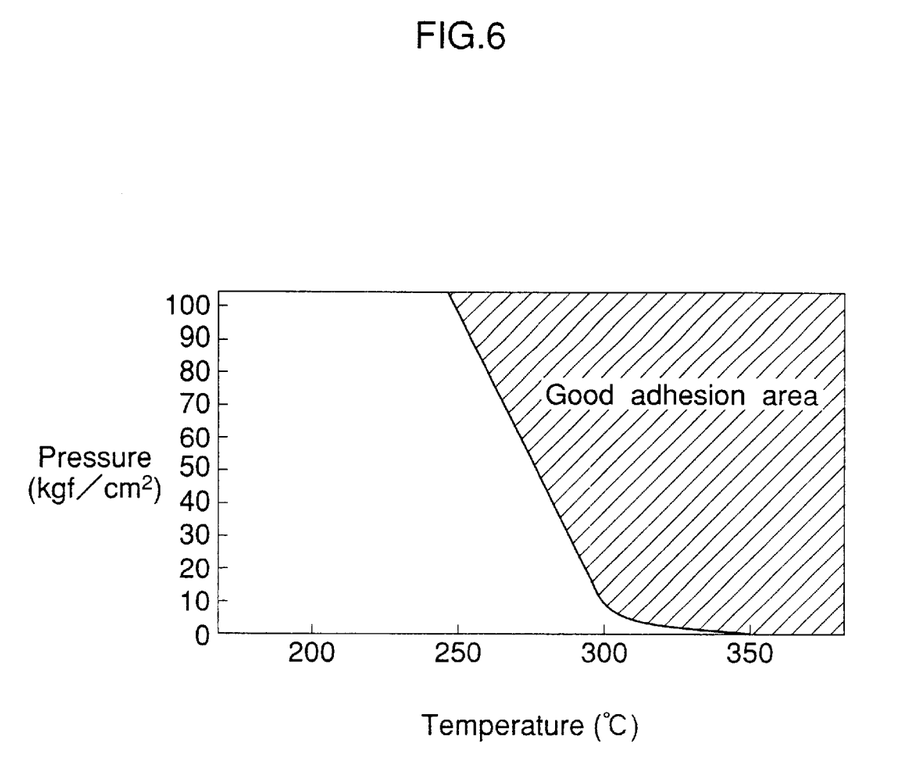
FIG. 6 is a graph showing an example of the specific relationship between the temperature and pressure in a thermoplastic polyimide resin material.

The lower surface of the lead frame 2 shown in FIG. 5 is positioned to the upper surface of the semiconductor chip 1, on which the protective film 11 is formed, and the upper surface of the semiconductor chip 1 is brought into contact with the lower surface of the distal end portion of each inner lead 15 with only the protective film 11 interposed therebetween such that the bonding pads 13 appear between the opposing bus bars 18. The resultant structure is heated to a predetermined temperature T2, and pressed for bonding the lower surface of the distal end portion of each inner lead 15 to the upper surface of the semiconductor chip 1 (step S13). The predetermined temperature T2 is higher than the plastication temperature of the protective film 11, so the lower surface of the distal end portion of each inner lead 13 is reliably bonded and fixed to the upper surface of the semiconductor chip 1, as shown in FIG. 2. FIG. 6 shows an example of a specific relationship between the temperature and pressure in a thermoplastic polyimide resin film used as the protective film 11. In FIG. 6, the abscissa represents the temperature (° C.); the ordinate, the pressure ($kgf/cm^2$); and the hatched portion, a range where a good adhesion effect can be obtained. The predetermined temperature T2 may be defined on the basis of FIG. 6.

The semiconductor chip 1 is loaded into a furnace and subjected to post-baking to reliably bond and fix the lower surface of the distal end portion of each inner lead 15 to the upper surface of the semiconductor chip 1 (step S14: this step can be omitted in some cases). The bonding pad 13 in each opening 12 formed in the protective film 11 is connected to the upper surface of the distal end portion of a corresponding inner lead 15 by the bonding wire 21 using wire bonding (step S15). Resin molding is performed to cover the entire semiconductor chip 1 (step S16), thereby completing a package.

As described above, in the first embodiment, a thermoplastic polyimide (or polyamide) resin film is formed as the protective film 11 applied to the surface of the semiconductor chip 1, and the semiconductor chip 1 and the inner leads 15 are bonded and fixed under predetermined temperature adjustment. In this case, not an insulating member such as an insulating tape but only the protective film 11 is interposed between the semiconductor chip 1 and the inner leads 15, and the protective film 11 is used not only as an α-ray protective film but also as an insulating material and an adhesive material. Since the semiconductor chip 1 and the inner leads 15 are fixed with a very simple arrangement, the manufacturing process can be largely simplified, and the number of processes can be reduced. In addition, when the thickness of the protective film 11 is so adjusted as to absorb the stress due to the temperature cycle, cracks in the sealing resin and the semiconductor chip 1 can be prevented.

Therefore, according to the first embodiment, a semiconductor device having a simple LOC structure can be easily and reliably realized without using an insulating tape for bonding the semiconductor chip 1 to the inner leads 15.

Second Embodiment

Figure 7:
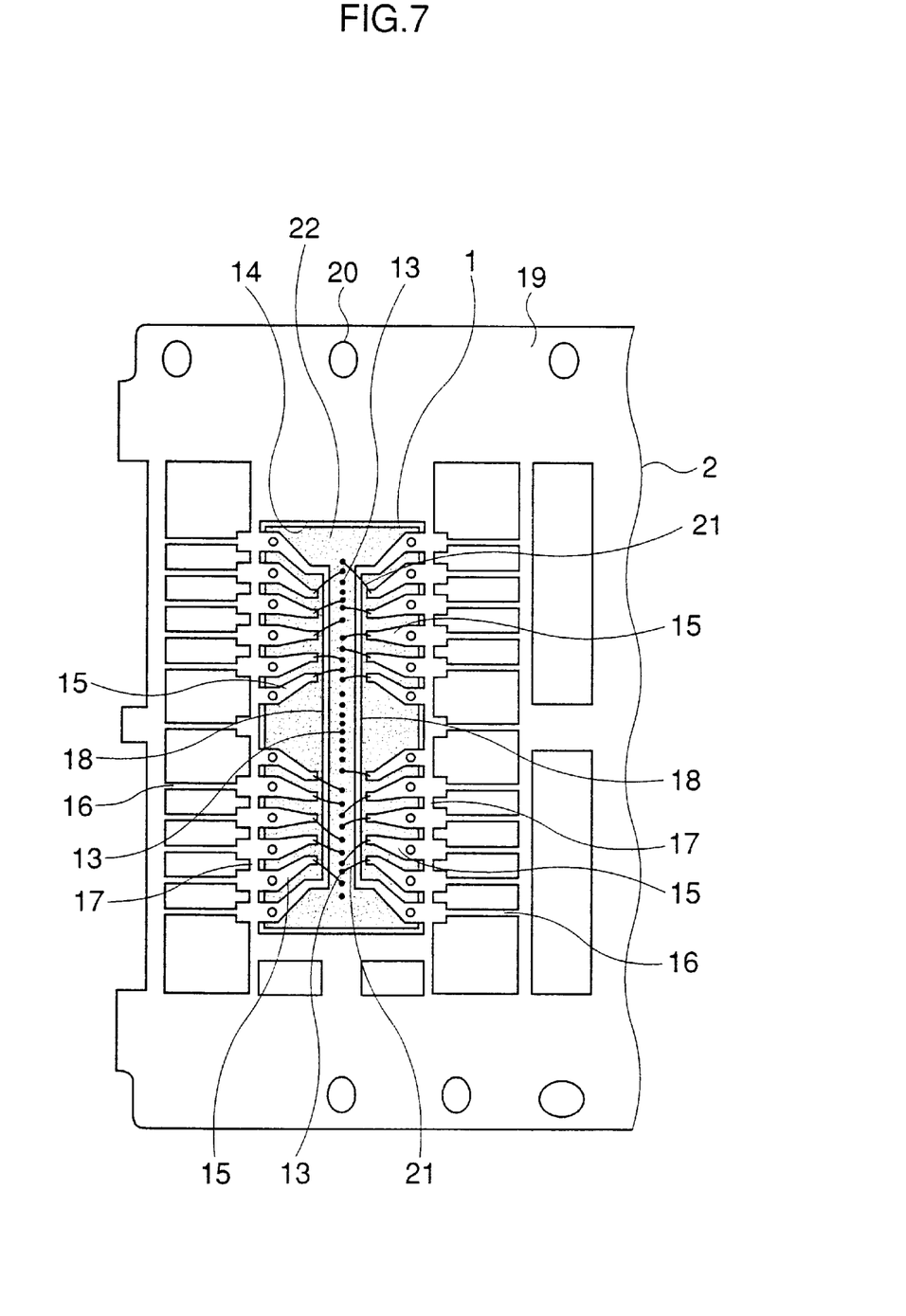
FIG. 7 is a schematic plan view showing a semiconductor device according to the second embodiment of the present invention.
Figure 8:
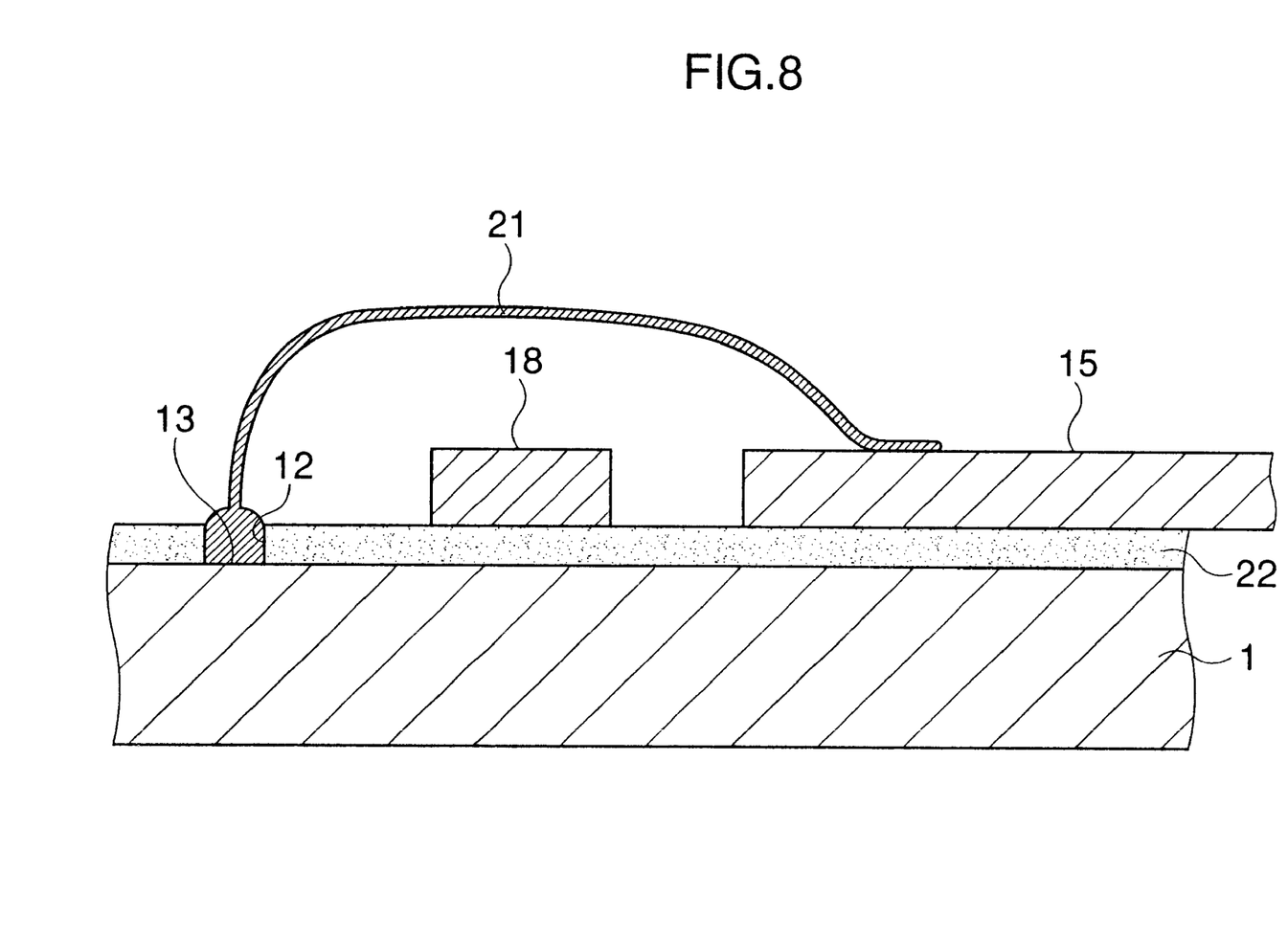
FIG. 8 is a schematic sectional view showing a region from an inner lead to a portion near a bonding pad shown in FIG. 7.

The second embodiment will be described next. The schematic arrangement of a semiconductor device according to the second embodiment is almost the same as in the first embodiment except the main material of the protective film. FIG. 7 is a plan view schematically showing the semiconductor device from which the mold resin is removed. FIG. 8 is a sectional view showing a region from an inner lead 15 to a portion near a bonding pad 13 shown in FIG. 7. The same reference numerals as in the semiconductor device of the first embodiment denote the same members in the second embodiment. In this semiconductor device, a protective film 22 applied to the upper surface of a semiconductor chip 1 consists of a thermosetting resin material such as a thermosetting polyimide resin or a thermosetting polyamide resin. The remaining arrangements are the same as in the semiconductor device of the first embodiment.

Figure 9:
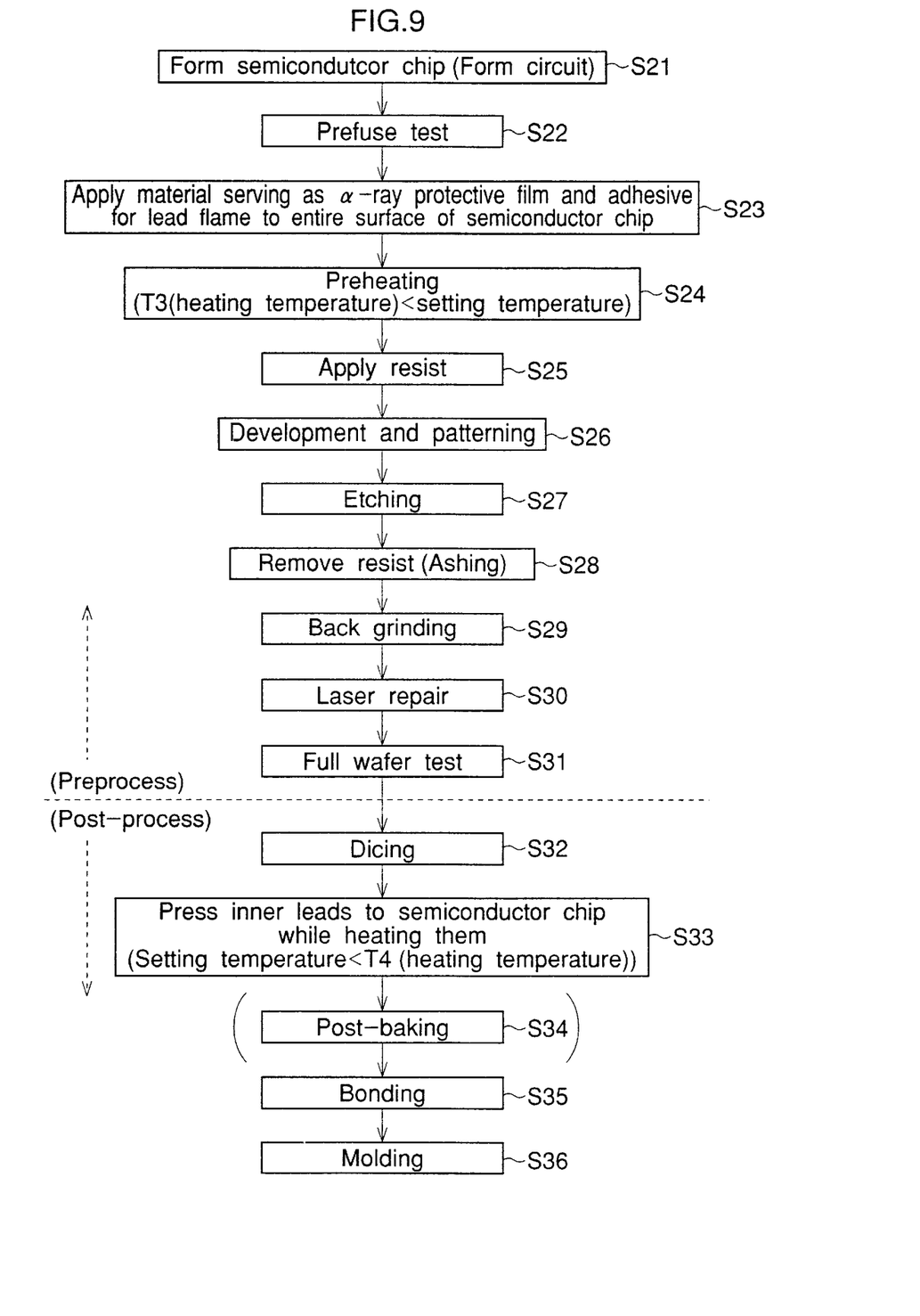
FIG. 9 is a schematic flow chart showing the steps in manufacturing the semiconductor device according to the second embodiment.
Figure 10:
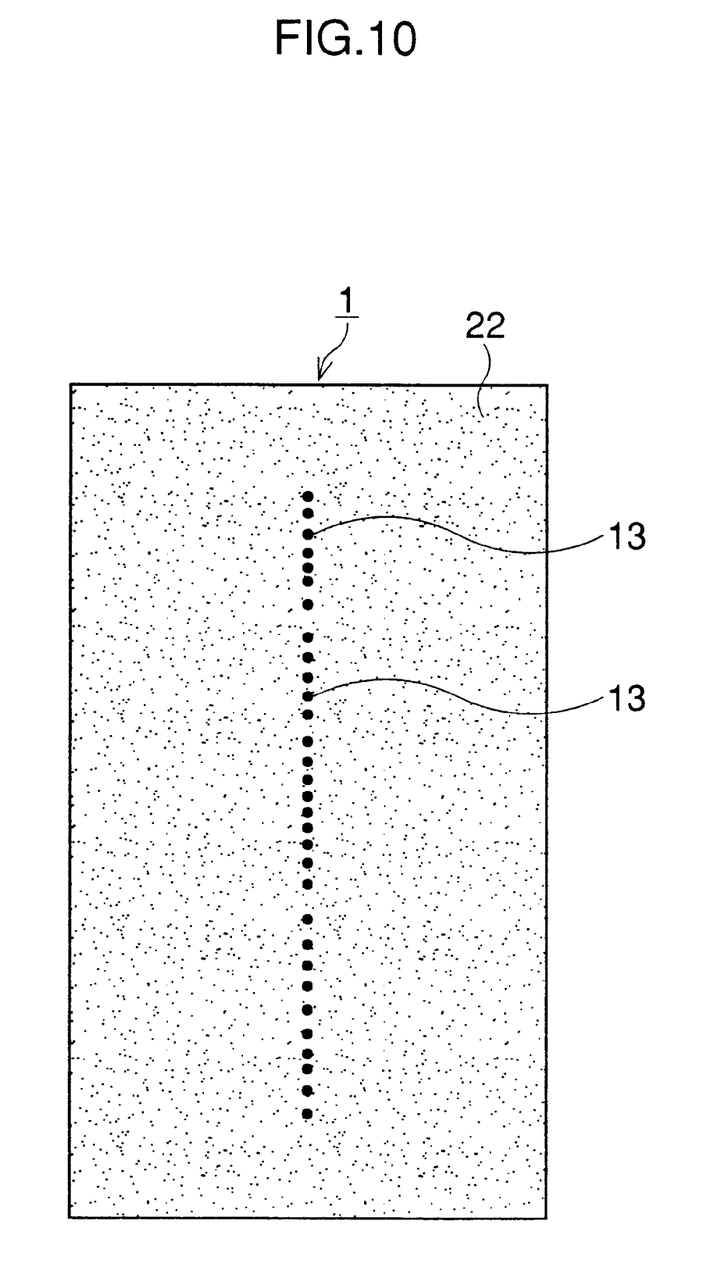
FIG. 10 is a schematic plan view showing a semiconductor chip of the second embodiment.

A method of manufacturing the semiconductor device of the second embodiment will be described next. FIG. 9 is a schematic flow chart showing the steps in manufacturing the semiconductor device. FIG. 10 is a plan view of the semiconductor chip.

The manufacturing process is divided into a preprocess group before cutting a semiconductor wafer into semiconductor chips and a post-process group after cutting. In the first step of the preprocess group, memory cells and their peripheral circuits are formed on a semiconductor wafer, and the plurality of semiconductor chips 1 are formed on the semiconductor wafer (step S21).

After the prefuse test of the semiconductor chips 1 (step S22), the protective film 22 consisting of a thermosetting resin film, e.g., a thermosetting polyimide resin film or a thermosetting polyamide resin film in this case, serving not only as an a -ray protective film and but also as an adhesive and an insulating material is applied to the entire surface of each semiconductor chip 1, as shown in FIG. 10 (step S23). The semiconductor wafer on which the protective film 22 is formed is heated at a predetermined temperature T3 to make the protective film 22 elastic and facilitate fabrication (step S24). The predetermined temperature T3 must be lower than the setting temperature of the protective film 22. A photoresist is applied to the surface of the protective film 22 of each semiconductor chip 1 (step S25), and developed and patterned by photolithography to form an etching mask (step S26). The protective film 22 is anisotropically etched into a shape conforming to the etching mask, and a plurality of openings 12 are formed in the protective film 22 to expose the surfaces of the bonding pads 13 formed on the semiconductor chip 1 under the protective film 22 (step S27).

The resist mask is removed by ashing using $O_2$ plasma (step S28). Back grinding (step S29) and laser repair (step S30) are performed, and a full wafer test is performed in the final step of the preprocess group (step S31).

Next, in the first step of the post-process group, dicing is performed to cut the semiconductor wafer into the semiconductor chips (step S32). In the second embodiment, no insulating tape need be formed, unlike the prior art, so the steps of manufacturing this insulating tape are omitted, as in the first embodiment.

The lower surface of a lead frame 2 as shown in FIG. 5 is positioned to the upper surface of the semiconductor chip 1, on which the protective film 22 is formed, and the upper surface of the semiconductor chip 1 is brought into contact with the lower surface of the distal end portion of each inner lead 15 with only the protective film 22 interposed therebetween such that the bonding pads 13 appear between opposing bus bars 18. The resultant structure is heated to a predetermined temperature T4, and pressed for bonding the lower surface of the distal end portion of each inner lead 15 to the upper surface of the semiconductor chip 1 (step S33). The predetermined temperature T4 is higher than the setting temperature of the protective film 22, so the lower surface of the distal end portion of each inner lead 15 is reliably bonded and fixed to the upper surface of the semiconductor chip 1, as shown in FIG. 8.

The semiconductor chip 1 is loaded into a furnace and subjected to post-baking to reliably bond and fix the lower surface of the distal end portion of each inner lead 15 to the upper surface of the semiconductor chip 1 (step S34: this step can be omitted in some cases). The bonding pad 13 in each opening 12 formed in the protective film 22 is connected to the upper surface of the distal end portion of a corresponding inner lead 15 by a bonding wire 21 using wire bonding (step S35). Resin molding is performed to cover the entire semiconductor chip 1 (step S36), thereby completing a package.

As described above, in the second embodiment, a thermosetting polyimide (or polyamide) resin film is formed as the protective film 22 applied to the surface of the semiconductor chip 1, and the semiconductor chip 1 and the inner leads 15 are bonded and fixed under predetermined temperature adjustment. In this case, not an insulating member such as an insulating tape but only the protective film 22 is interposed between the semiconductor chip 1 and the inner leads 15, and the protective film 22 is used not only as an α-ray protective film but also as an insulating material and an adhesive material. Since the semiconductor chip 1 and the inner leads 15 are fixed with a very simple arrangement, the manufacturing process can be largely simplified, and the number of processes can be reduced. In addition, when the thickness of the protective film 22 is so adjusted as to absorb the stress due to the temperature cycle, cracks in the sealing resin and the semiconductor chip 1 can be prevented.

Therefore, according to the second embodiment, a semiconductor device having a simple LOC structure can be easily and reliably realized without using an insulating tape for bonding the semiconductor chip 1 to the inner leads 15.

What is claimed is:

1. A method of manufacturing a semiconductor device, comprising:

the first step of applying a thermoplastic resin material to which a volatile component is added, to an entire surface of a semiconductor wafer;

the second step of heating said semiconductor wafer at a first temperature;

the third step of cutting said semiconductor wafer into a plurality of semiconductor chips;

the fourth step of bringing said semiconductor chip into contact with an inner lead with only said thermoplastic resin material interposed therebetween, pressing said semiconductor chip against said inner lead while heating said semiconductor chip and said inner lead at a second temperature higher than the first temperature; and the fifth step of connecting a bonding pad on said semiconductor chip to said inner lead by a bonding wire.

2. The method according to claim 1, wherein the first temperature is higher than an volatilization temperature of said volatile component and lower than a plastication temperature of said thermoplastic resin material, and the second temperature is higher than the plastication temperature of said thermoplastic resin material.

3. The method according to claim 1, further comprises, between the second step and the third step, the sixth step of forming an opening in said thermoplastic resin material to expose a surface of said bonding pad, and wherein the fifth step includes connecting said bonding pad in the opening to said inner lead by said bonding wire.

4. The method according to claim 1, wherein said thermoplastic resin material is at least one of a thermoplastic polyimide resin material and a thermoplastic polyamide resin material.

5. A method of manufacturing a semiconductor device, comprising:

the first step of applying a thermosetting resin material to an entire surface of a semiconductor wafer;

the second step of heating said semiconductor wafer at a first temperature to make said thermosetting resin material elastic and facilitate fabrication;

the third step of cutting said semiconductor wafer into a plurality of semiconductor chips;

the fourth step of bringing said semiconductor chip into contact with an inner lead with only said thermosetting resin material interposed therebetween, pressing said semiconductor chip against said inner lead while heating said semiconductor chip and said inner lead at a second temperature higher than the first temperature; and the fifth step of connecting a bonding pad on said semiconductor chip to said inner lead by a bonding wire.

6. The method according to claim 5, wherein the first temperature is lower than a setting temperature of said thermosetting resin material, and the second temperature is higher than the setting temperature of said thermosetting resin material.

7. The method according to claim 5, further comprises, between the second step and the third step, the sixth step of forming an opening in said thermosetting resin material to expose a surface of said bonding pad, and wherein the fifth step includes connecting said bonding pad in the opening to said inner lead by said bonding wire.

8. The method according to claim 5, wherein said thermosetting resin material is at least one of a thermosetting polyimide resin material and a thermosetting polyamide resin material.

* * * * *